(12) United States Patent
Koide

(10) Patent No.: US 7,224,597 B2
(45) Date of Patent: May 29, 2007

(54) FERROELECTRIC MEMORY DEVICE, ELECTRONIC APPARATUS

(75) Inventor: Yasunori Koide, Nagano (JP)

(73) Assignee: Seiko Epson Corporation (JP)

( * ) Notice: Subject to any disclaimer, the term of this patent is extended or adjusted under 35 U.S.C. 154(b) by 8 days.

(21) Appl. No.: 11/145,316

(22) Filed: Jun. 3, 2005

(65) Prior Publication Data

US 2005/0281070 A1    Dec. 22, 2005

(30) Foreign Application Priority Data

Jun. 18, 2004    (JP) .............................. 2004-180780

(51) Int. Cl.
G11C 11/22    (2006.01)
(52) U.S. Cl. ...................... 365/145; 365/200
(58) Field of Classification Search ................ 365/145, 365/200
See application file for complete search history.

(56) References Cited

U.S. PATENT DOCUMENTS 5,621,690 A * 4/1997 Jungroth et al. ............ 365/200
6,831,869 B2 * 12/2004 Yamano ...................... 365/200
2002/0067639 A1 * 6/2002 Byeon et al. .......... 365/185.11
2003/0142563 A1 * 7/2003 Yamano ...................... 365/200

FOREIGN PATENT DOCUMENTS

JP    2001-126493    5/2001

\* cited by examiner

Primary Examiner—Michael Tran
(74) Attorney, Agent, or Firm—Harness, Dickey & Pierce, P.L.C.

(57) ABSTRACT

A ferroelectric memory device includes a main bit line, a plurality of local bit lines associated with the main bit line and disposed intersecting word lines, a plurality of first switching elements provided between the local bit lines and the main bit line, respectively, a plurality of memory cells provided at intersecting positions between the word lines and each of the plurality of local bit lines, and a plurality of redundant memory cells provided at intersecting positions between the main bit line and the word lines, wherein a malfunctioning memory cell is prohibited from operating and a redundant memory cell performs a substitute operation, and the plurality of first switching elements are operated such that the local bit line connected with the malfunctioning memory cell is connected to the main bit line.

9 Claims, 5 Drawing Sheets

FERROELECTRIC MEMORY DEVICE, ELECTRONIC APPARATUS

RELATED APPLICATIONS

This application claims priority to Japanese Patent Application No. 2004-180780 filed Jun. 18, 2004 which is hereby expressly incorporated by reference herein in its entirety.

BACKGROUND

1. Technical Field

The present invention relates to ferroelectric memory devices (ferroelectric memories) that use ferroelectric capacitors, and electronic apparatuses equipped with the same, and more particularly, to improvement of the redundancy relief technology in ferroelectric memory devices that adopt the hierarchical bit line structure.

2. Related Art

The redundancy relief technology, in which a malfunctioning memory cell (defective memory cell) is replaced with another memory cell for operation, is important in order to improve yield at the time of manufacturing ferroelectric memory devices (FeRAMs). As such a redundancy relief technology, for example, Japanese Laid-open Patent Application 2001-126493 discloses a method in which a row including a defective memory cell is replaced with a redundant row.

It is noted that, in a ferroelectric memory, theoretically, its bit line capacitance cannot be made substantially large, and therefore the use of the hierarchical bit line structure is effective for greater capacity and higher integration of memories. It is noted here that the hierarchical bit line structure refers to a structure in which a plurality of local bit lines each having a predetermined number of memory cells connected thereto are associated with each main bit line, and any of the local bit lines is connected to the main bit line by using a switch.

Even when such a hierarchical bit line structure is adopted, the redundant relief technology is important for improving yield. However, it is difficult to use the above-described redundant relief technology as it is. This is because, in a ferroelectric memory, the potential on a bit line to be read depends on the parasitic capacitance of the bit line, and therefore the bit line capacitances need to be matched between instances when using a redundant memory cell and using a normal memory cell, in order to perform a row redundancy in the case of the hierarchical bit line structure. Also, when redundant cells are provided in each of local bit lines, and when defects occur concentrated on a certain local bit line, replacement with redundant cells on different local bit lines is difficult, and the relief efficiency is poor.

Therefore, it is an object of the present invention to provide a redundancy relieve technology that is capable of suppressing changes in the bit line capacitance at the time of reading in a ferroelectric memory device that adopts the hierarchical bit line system, and also increasing the relieve efficiency thereof.

SUMMARY

A first embodiment of the present invention pertains to a ferroelectric memory device for storing data by using a plurality of memory cells composed of combinations of ferroelectric capacitors and transistors, and the ferroelectric memory device includes: a main bit line disposed intersecting word lines; a plurality of local bit lines associated with the main bit line and disposed intersecting the word lines; a plurality of first switching elements provided between the local bit lines and the main bit line, respectively, for selectively connecting one of the plurality of local bit lines to the main bit line; a plurality of memory cells provided at intersecting positions between the word lines and the plurality of local bit lines, respectively; and a plurality of redundant memory cells provided at intersecting positions between the main bit line and the word lines, wherein, when the memory cells include a malfunctioning memory cell, the malfunctioning memory cell is prohibited from operating and the redundant memory cell performs a substitute operation, and conduction states of the plurality of first switching elements are set such that the local bit line connected with the malfunctioning memory cell is connected to the main bit line.

By such a structure, even when the hierarchical bit line system is adopted, the redundant memory cells are not hierarchized but connected to the main bit line. Even when the redundant memory cell is selected, one of the local bit lines is maintained in a state connected to the main bit line. Therefore, even when a redundancy relief is performed, changes in the bit line capacitance at the time of reading can be suppressed. Also, the number of redundant rows can be freely set, and thus the relieve efficiency can be improved.

Also, a redundancy control circuit that controls to have the redundant memory cell operate as a substitute of the malfunctioning memory cell may be included, wherein, when an address signal designating the malfunctioning memory cell is inputted as a target for data reading or data writing, the redundancy control circuit may preferably (a) output a prohibition signal to prohibit an operation of the malfunctioning memory cell, (b) output a permission signal to permit an operation of one of the redundant memory cells to be substituted for the malfunctioning memory cell, and (c) keep a conduction state of the first switching element that is provided between the local bit line connected with the malfunctioning memory cell and the main bit line associated with the local bit line.

Because such a redundancy control circuit is provided, the redundancy relief operation for the ferroelectric memory device in accordance with the present invention can be readily controlled.

Also, second switching elements provided between the redundant memory cells and the main bit line, respectively, may further be included, wherein, when an address signal designating the malfunctioning memory cell is inputted as a target for data reading or data writing, the redundancy control circuit may preferably output a second control signal to make the second switching elements conductive.

By this, the structure of the redundant memory cells becomes to be generally the same as that of the normal memory cells, which is convenient because differences in various conditions such as electrical characteristics become smaller.

Furthermore, preferably, the permission signal may also serve as the second control signal.

By this, generation of the second control signal becomes facilitated, and simplification of the structure becomes possible.

Also, an output signal obtained by inputting the first control signal outputted to each of the first switching elements in a logical sum circuit may preferably be used as the second control signal.

By such a structure, the difference in electrical characteristics at the time of reading or writing between the redundant memory cell and the normal memory cell becomes extremely small. Further, generation of the second control signal becomes facilitated, and simplification of the structure becomes possible.

Also, the first switching element and the second switching element may preferably have substantially identical characteristics.

By this, the compositions (structures) of the redundant memory cell and the normal memory cell become more accurately matched with one another, and their characteristics can be made uniform. It is also convenient in terms of the manufacturing process because the first and second switching elements can be formed by the same process.

A second embodiment of the present invention pertains to an electronic apparatus equipped with the ferroelectric memory device described above. It is noted here that the "electronic apparatus" refers to apparatuses in general that perform certain functions, and includes, without being limited to any particular structure, all devices that require storage devices, such as, computer devices in general, cellular phones, PHS, PDA, electronic notebooks, IC cards and the like, which are equipped with the semiconductor devices described above.

DETAILED DESCRIPTION

Embodiments of the present invention are described below with reference to the accompanying drawings.

Figure 1:
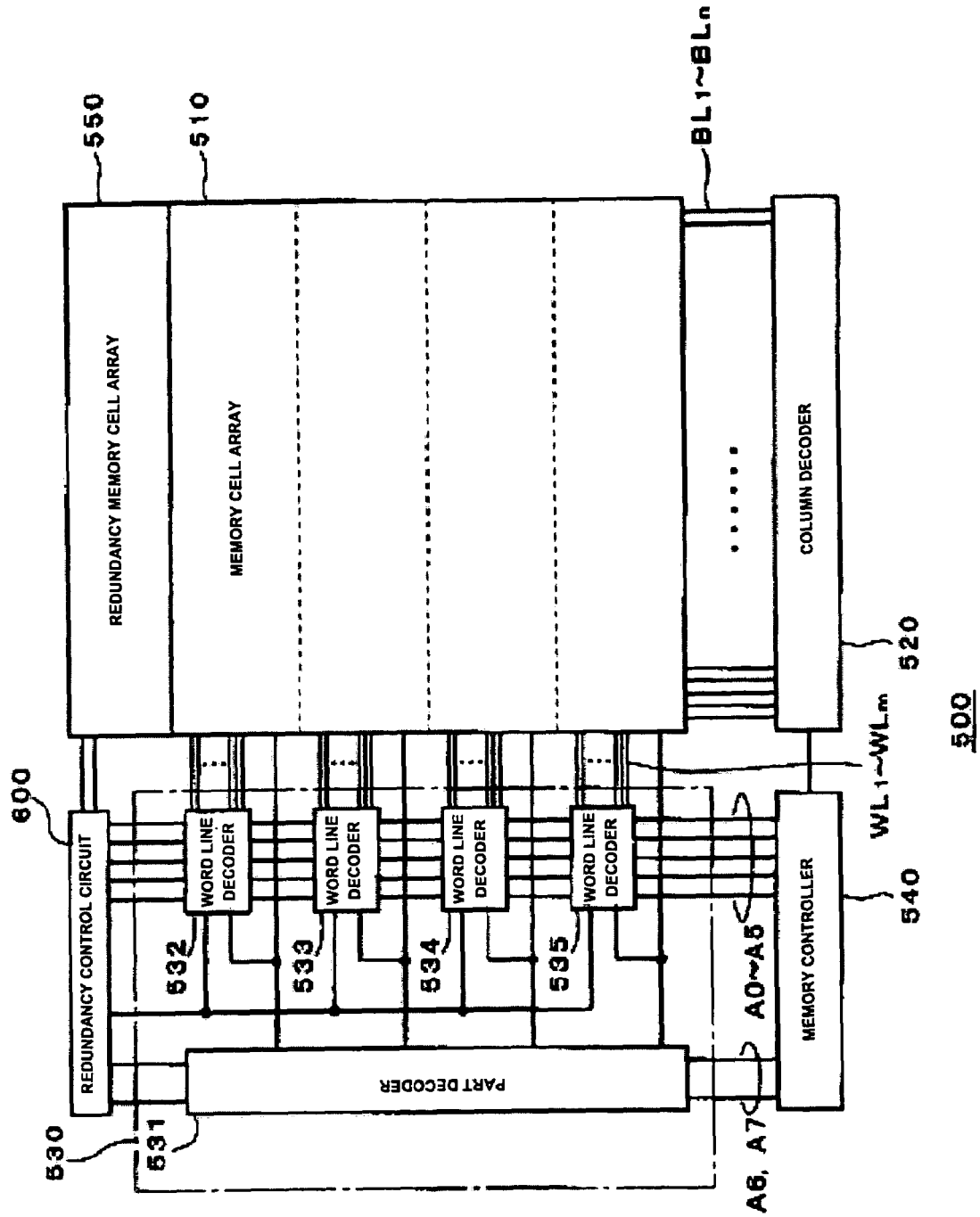
FIG. 1 is a diagram showing a structure of a ferroelectric memory device in accordance with an embodiment.

FIG. 1 is a diagram showing a structure of a ferroelectric memory device 500 in accordance with an embodiment. The ferroelectric memory device 500 shown in FIG. 1 is formed from a memory cell array 510, a column decoder 520, a row decoder 530, a memory controller 540, a redundant memory cell array 550, and a redundancy control circuit 600.

The memory cell array 510 is formed from a plurality of memory cells disposed in an array configuration. As each of the memory cells, for example, a 1T1C type that combines one transistor and one ferroelectric capacitor can be adopted. Each one of the memory cells is disposed at each of intersecting positions between word lines $WL_1$–$WL_m$ (m is an integer that is 2 or greater) and bit lines $BL_1$–$BL_n$ (n is an integer that is 2 or greater) which are disposed mutually orthogonal to one another, and its operation is controlled through any of the bit lines and word lines. The present embodiment adopts a so-called hierarchical bit line structure, in which a plurality of local bit lines are disposed associated with each of the bit lines (main bit lines), and the memory cells are connected at intersecting positions of each of the local bit lines and the word lines.

The redundant memory cell array 550 is formed from a plurality of redundant memory cells disposed in an array configuration. It is noted here that the redundant memory cell is a memory cell that is prepared to be used, when the plurality of memory cells included in the above-described memory cell array 510 include a malfunctioning memory cell, as a substitute for the malfunctioning memory cell. As each of the redundant memory cells, one having the same structure as each of the memory cells included in the above-described memory cell array 510 is used. In the present embodiment, a hierarchical bit line structure is not adopted for the redundant memory cells, but each of the redundant memory cells is provided at each of intersecting positions between each of the main bit lines and the word lines.

Connection relation between the main bit lines and the redundant memory cells in accordance with the present embodiment is described below in detail.

Figure 2:
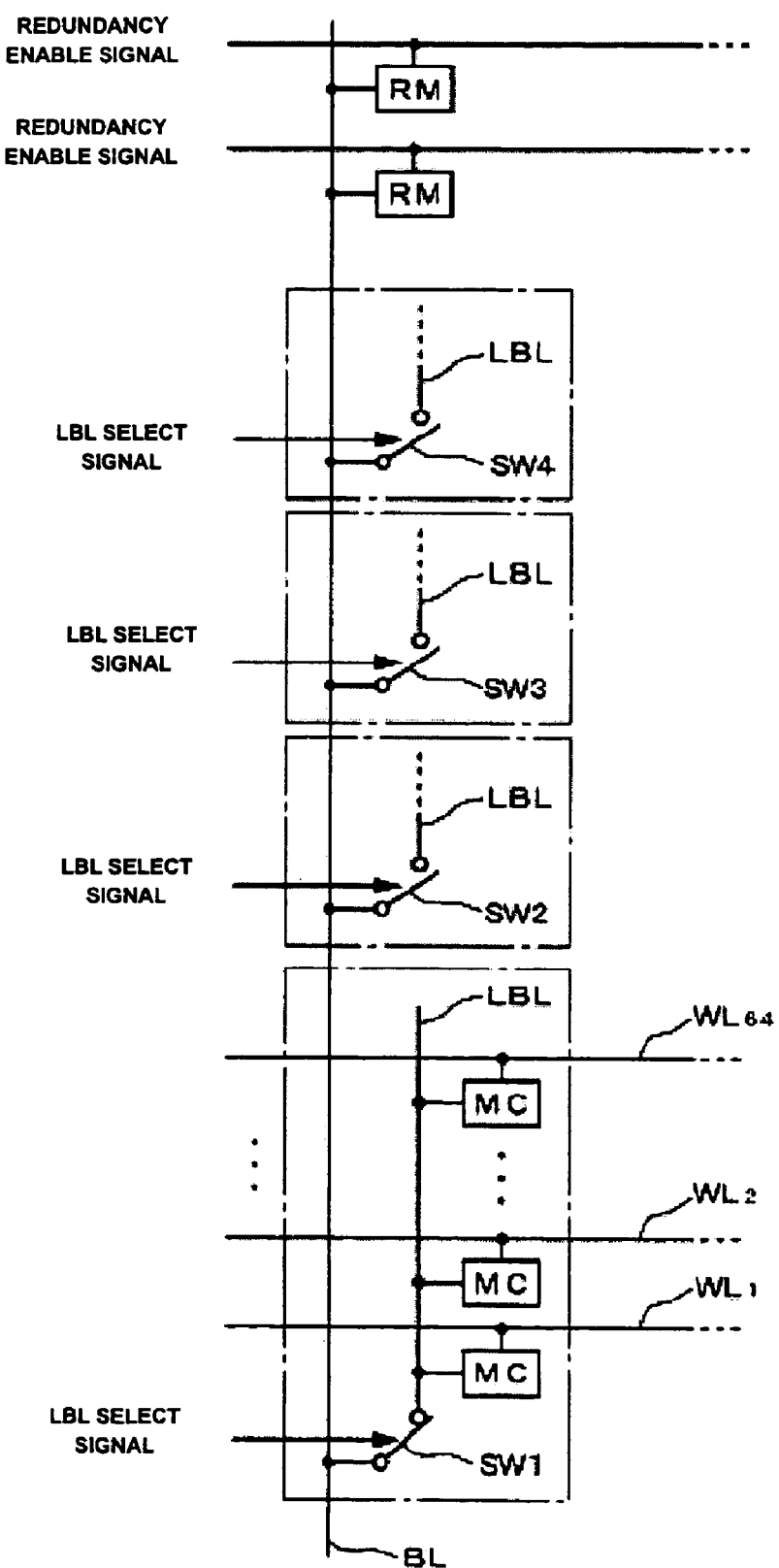
FIG. 2 is a diagram for describing details of the connection relation between the main bit lines, the local bit lines and the memory cells.

FIG. 2 is a diagram for describing details of the connection relation between the main bit lines, the local bit lines and the memory cells. The ferroelectric memory device in accordance with the present embodiment adopts a hierarchical bit line structure in which each one of the main bit lines is associated with a plurality of local bit lines, and can be selectively connected to any one of the local bit lines.

As shown in the figure, in the present example, one bit line BL is associated with four local bit lines LBL. Any arbitrary number of memory cells may be connected to each of the local bit lines LBL; and in the present example, 64 memory cells (MC) are connected for each of the local bit lines LBL. Also, the number of redundant memory cells (RM) may be set arbitrarily in consideration of the event probability of defective memory cells and the like, and two of them are prepared in the present example. These redundant memory cells are directly connected to the main bit line. In other words, in the present example, a memory device composed of 258 rows (256 rows+2 rows) is described as an example.

For each of the main bit lines BL, switching elements SW1–SW4 are provided between the local bit lines LBL and the main bit line BL, respectively, for selectively connecting one of the plurality of local bit lines LBL associated with the main bit line. Based on a control signal outputted from the row decoder 530, one of the switching elements $SW_1$–$SW_4$ selectively becomes conductive, such that one of the local bit lines LBL is connected to the main bit line BL. As the switching elements, for example, MOS transistors are suitably used. In particular, the use of a transistor similar to the transistor composing each of the memory cells is preferred in terms of process for manufacturing the ferroelectric memory device in accordance with the present embodiment.

The column decoder 520 controls potentials on the bit lines $BL_1$–$BL_n$. Concretely, the column decoder 520 receives a column address signal from the memory controller 540, and selects a specified one of the bit lines based on the column address signal.

The row decoder 530 controls potentials on the word lines $WL_1$–$WL_m$. Further, it generates a LBL select signal for connecting any of the local bit lines corresponding to the selected word line. Concretely, the row decoder 530 receives a row address signal from the memory controller 540, generates an LBL select signal based on the row address signal, connects the local bit line, and selects the specified word line. The row decoder 530 of the present embodiment is formed from a part decoder 531 that generates the LBL select signal, and word line decoders 532, 533, 534 and 535 that generate word line selection signals, whereby the above-described selection operation is achieved.

The memory controller 540 integrally controls operations of the ferroelectric memory device 500. Concretely, the memory controller 540 supplies column address signals to the column decoder 520 and row address signals to the row decoder 530 for reading data from each of the memory cells or writing data in each of the memory cells. Also, the memory controller 540 generates a drive voltage for driving the ferroelectric memory device 500 and supplies the same to each section therein.

The redundancy control circuit 600 performs a control to operate redundant memory cells as substitutes for defective memory cells. To perform such an operation, addresses of defective memory cells need to be memorized in advance in the redundancy control circuit 600. For example, the redundancy control circuit 600 may be provided with a memory device formed from metal fuses, ferroelectrics or the like, and addresses of defective memory cells that may be detected in an examination step at the time of manufacturing the ferroelectric memory device 500 may be stored in the memory device.

The row decoder 530 includes, for example, as shown in the figure, a part decoder 531, and word line decoders 532, 533, 534 and 535.

An address signal A6, A7 corresponding to upper 2 bits among an address signal outputted from the memory controller 540 is inputted in the part decoder 531, which then outputs control signals, i.e., LBL select signals, for selectively making one of the above-described switching elements SW1–SW4 conductive based on the address signal A6, A7 to the respective switching elements.

The word line decoders 532, 533, 534 and 535 are provided in a manner to be associated one-to-one with the local bit lines LBL, respectively, and connected to the corresponding memory cells connected to the respective local bit lines LBL through the word lines WL, respectively. An address signal A0–A5 corresponding to lower six bits among an address signal outputted from the memory controller 540 is inputted in each of the word line decoders 532, etc., which then applies an H level voltage (for example, a power supply voltage) to one of the word lines WL based on the address signal A0–A5. By this, a row selection is performed.

Next, operations of the ferroelectric memory device 500 in accordance with the present embodiment at the time of redundancy relief are described.

With an input of an address signal, an address designating a memory cell subjected to data reading or data writing is designated. When the address matches with an address of a defective memory cell (hereafter referred to as a "defective address"), the redundant control circuit 600 outputs a redundant enable signal (permission signal) to a redundant memory cell to be substituted for the defective memory cell for allowing its operation. By this, the memory cell in the redundant row is selected.

Also, in parallel with the operation described above, the part decoder 531 outputs an LBL select signal (first control signal) to make conductive the switching element (one of SW1–SW4) provided between the local bit line that is connected with the defective memory cell and the main bit line associated with the local bit line. In the present embodiment, the LBL select signal is generated by using the address signal A6, A7.

Also, in parallel with the operation described above, the redundant control circuit 600 outputs a redundant prohibition signal (prohibition signal) to prohibit operation of the defective memory cell. More concretely, corresponding to the address of the defective memory cell, a redundant prohibition signal is inputted in one of the word line decoders 532–535 from the redundant control circuit 600, whereby a row including the defective memory cell connected to the one of the word line decoders is placed in an unselected state. In the present embodiment, the LBL select signal generated by the part decoder 531 is used to decide one of the word line decoders 532–535, and the address signal A0–A5 is used to decide one of the word lines $WL_1$–$WL_{64}$ by the word line decoders 532–535.

When the redundancy prohibition signal described above is not inputted in the part decoder from the redundant control circuit 600, the LBL select signal performs a selection operation that is the same normal operation, whereby the switching element (the switching element SW1 in the illustrated example) between the local bit line connected with the defective memory cell and the main bit line associated with the local bit line is kept in a conductive state. In this state, the defective memory cell is not selected, and the redundant memory cell RM to be substituted for the defective memory cell is selected and read. In this instance, the defective memory cell is placed in an unselected state, but the local bit line connected with the defective memory cell is kept in a state connected with the main bit line, such that the bit line capacitance at the time of the substitute operation with the redundant memory cell can be made to have almost no change (no difference) compared to the normal operation in which such a substitute operation is not conducted.

Figure 3:
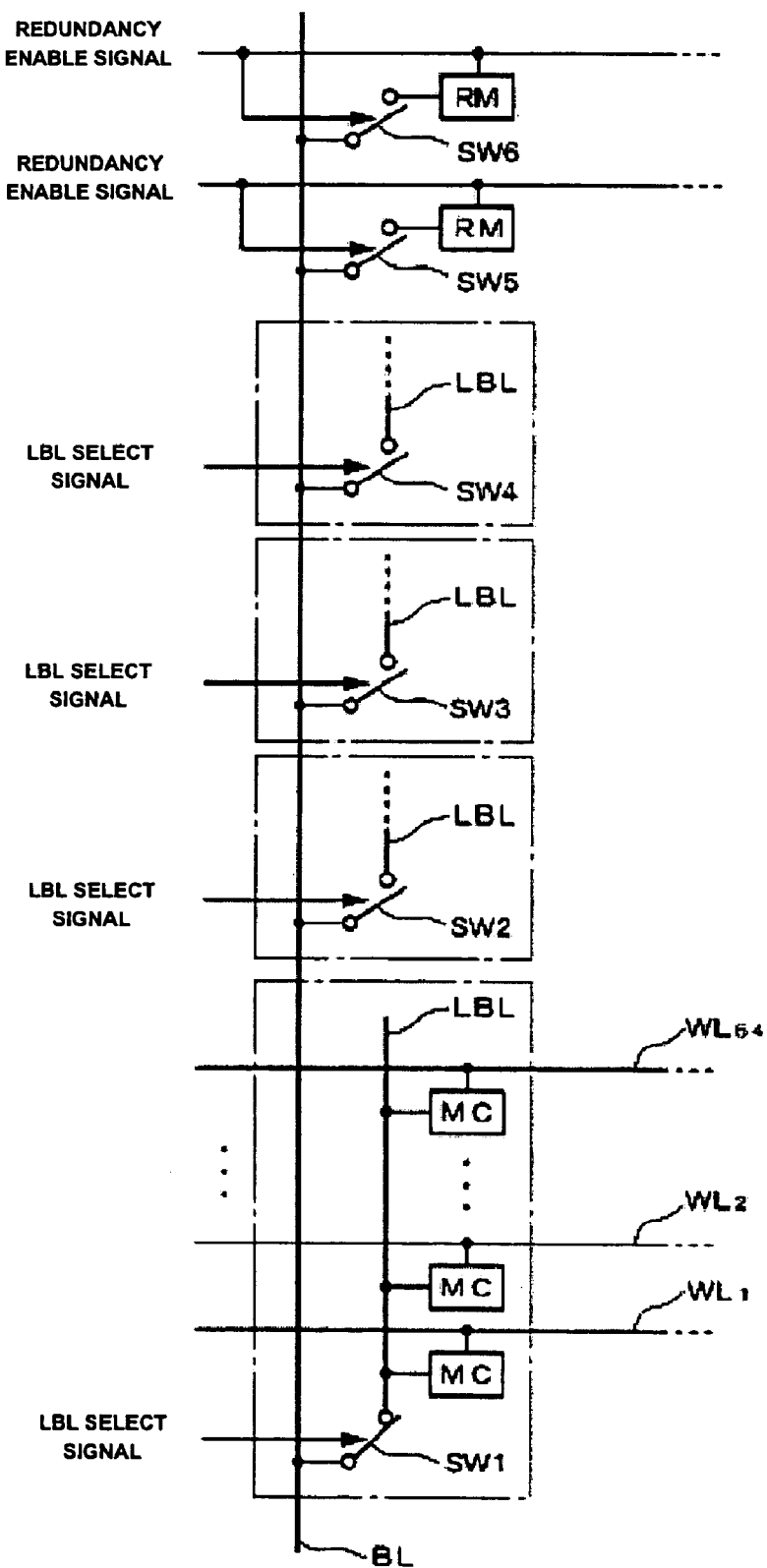
FIG. 3 is a diagram for describing another example of connection structure of the main bit lines, the local bit lines and the memory cells.

FIG. 3 is a diagram for describing another example of connection structure of the main bit lines, the local bit lines and the memory cells. The structural example shown in FIG. 3 is basically the same as the structure shown in FIG. 2, but different in that switching elements (second switching elements) SW5 and SW6 are provided between the redundant memory cells RM and the main bit line BL, respectively. When this structure is adopted, the redundant control circuit 600, when an address signal designating a defective memory cell as a target for data reading or data writing is inputted, outputs a control signal (second control signal) for making one of the switching elements conductive so as to connect one of the redundant memory cells to be operated as a substitute for the defective memory cell to the main bit line BL. By this, the structure of the redundant memory cells becomes to be generally the same as that of the normal memory cells, which is convenient in making the redundant memory cell to perform a substitute operation because differences in various conditions such as electrical characteristics become smaller.

It is noted that, as the switching element SW5, etc., for example, MOS transistors may suitably used. In particular, the use of a transistor similar to the transistor composing each of the memory cells is preferred in terms of process for manufacturing the ferroelectric memory device in accordance with the present embodiment. Furthermore, each of the switching elements SW1–SW4 as the first switching elements, and each of the switching elements SW5 and SW6 as the second switching elements may preferably be composed so that they have substantially the same characteristics in view of their physical structure, electrical characteristics and the like. For example, the device structures may be made generally identical, and the switching elements SW1–SW6 may be formed by the same process, whereby such conductions as described above can be achieved.

Also, it may be more suitable if the redundant enable signal described above is composed to serve also as the control signal for controlling the conductive state of each of the switching elements SW5 and SW6. By this, the circuit structure can be simplified.

Figure 4:
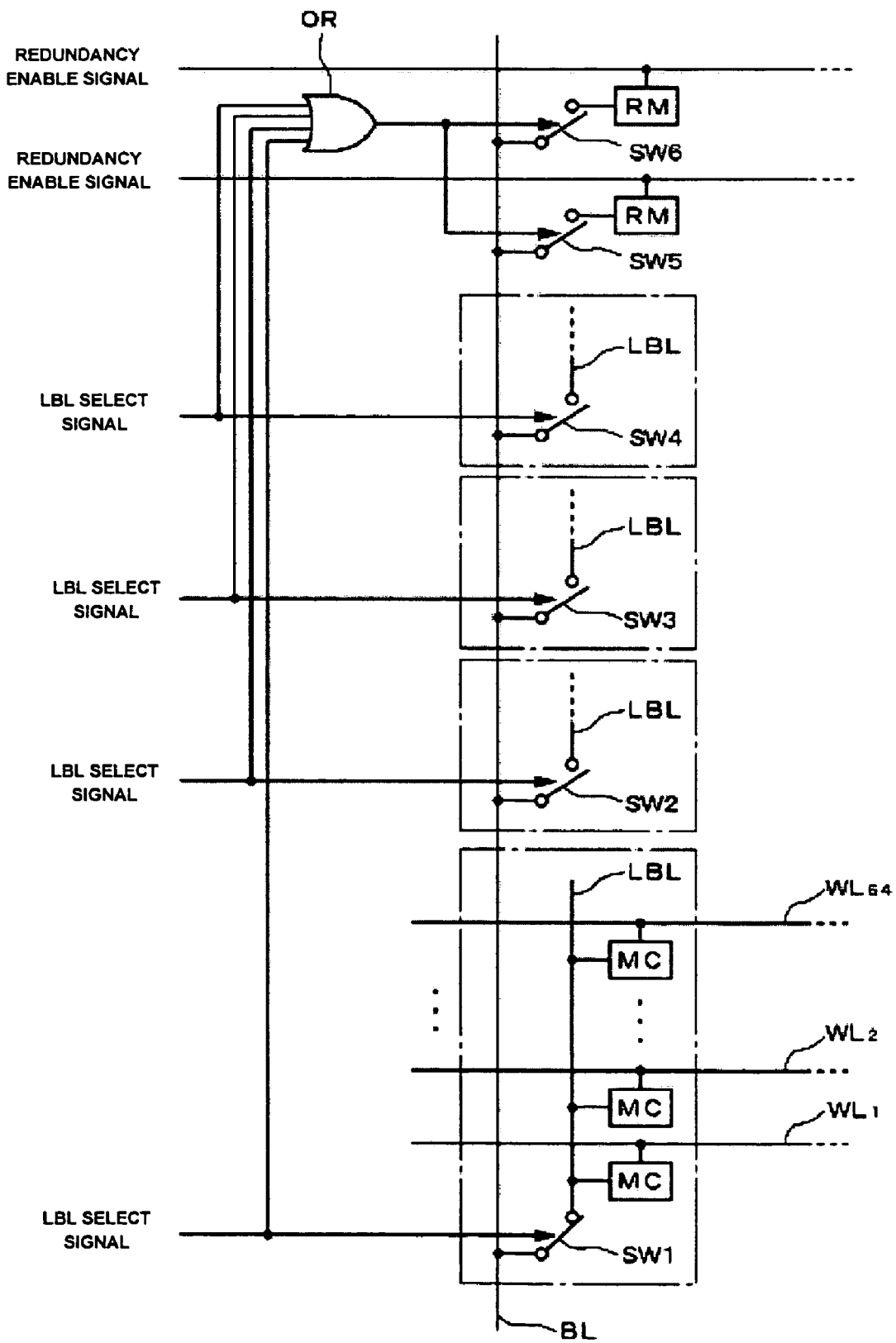
FIG. 4 is a diagram for describing another example of connection structure of the main bit lines, the local bit lines and the memory cells.

FIG. 4 is a diagram for describing another example of connection structure of the main bit lines, the local bit lines and the memory cells. The structural example shown in FIG. 4 is similar to the structure shown in FIG. 3, but different in the method for generating a control signal for performing operation control of each of the switching elements SW5 and SW6 as the second switching elements. Concretely, in the example, as illustrated, LBL select signals (first control signals) outputted to the switching elements SW1–SW4 as the first switching elements, respectively, are inputted in a logical sum circuit OR, and the obtained output signal is used as a second control signal to perform operation control of each of the switching elements SW5 and SW6. By such a structure, even when a substitute operation by a redundant memory cell is not needed (when it is disenabled), each of the switching elements SW5 and SW6 is placed in a conductive state, and the redundant memory cells RM and the main bit line BL become mutually connected. By this, changes in the bit line capacitance become extremely small between the case of the normal operation that selects memory cells MC and the case of the substitute operation by redundant memory cells, and therefore more excellent operations can be secured.

Figure 5:
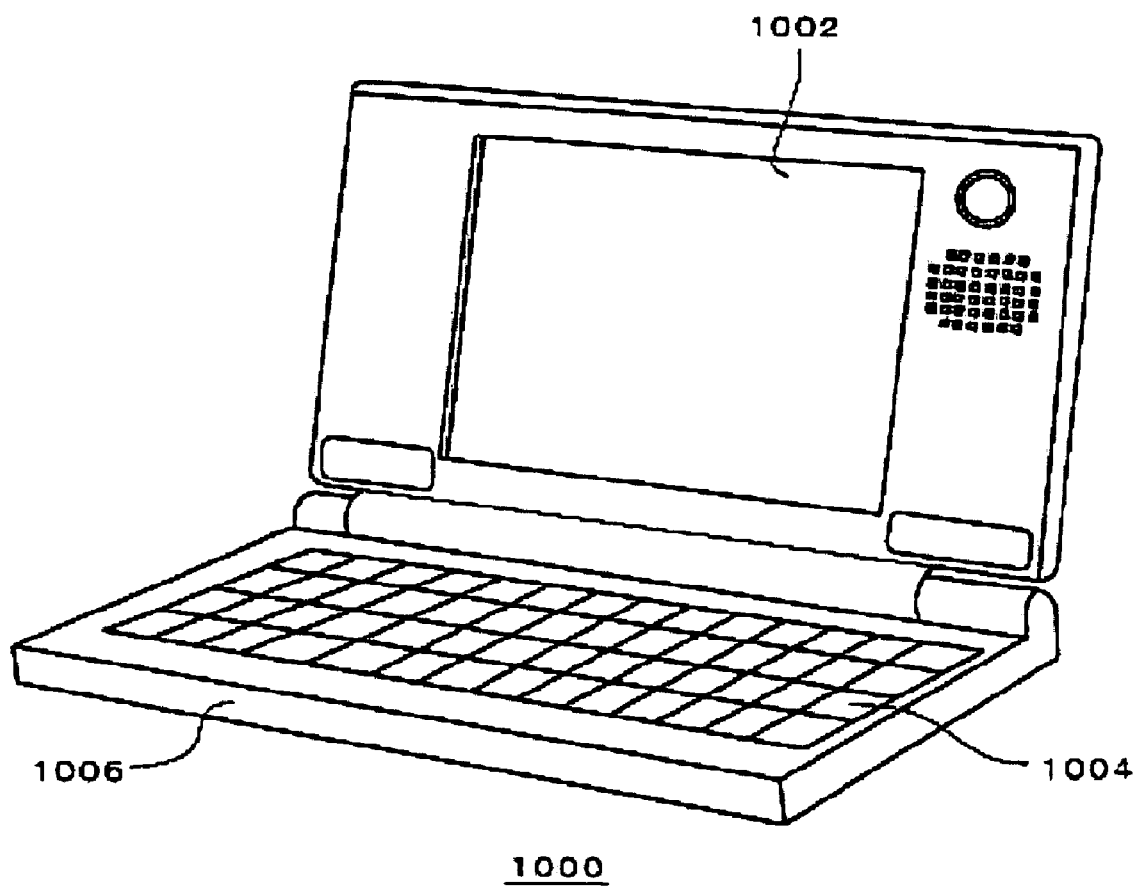
FIG. 5 is a perspective view showing an example of an electronic apparatus.

FIG. 5 is a perspective view showing a structure of a personal computer 1000 which is an example of an electronic apparatus equipped with the ferroelectric memory device of the present invention. In FIG. 5, the personal computer 1000 is equipped with a display panel 1002 and a main body section 1006 having a keyboard 1004. The ferroelectric memory device in accordance with the present embodiment is used as a memory medium, in particular, as a nonvolatile memory in the main body section 1006 of the personal computer 1000.

In this manner, in accordance with the present embodiment, when the hierarchical bit line system is adopted, the redundant memory cells RM are not hierarchized but connected to the main bit line BL, and even when the redundant memory cell RM is selected, one of the local bit lines LBL is maintained in a state connected to the main bit line BL. Therefore, even when a redundancy relief is performed, changes in the bit line capacitance at the time of reading can be suppressed. Also, the number of redundant rows can be freely set, and thus the relieve efficiency can be improved.

It is noted that the present invention is not limited to the contents of the embodiments described above, and many changes can be implemented within the range of the subject matter of the present invention.

What is claimed is:

1. A ferroelectric memory device for storing data by using a plurality of memory cells composed of combinations of ferroelectric capacitors and transistors, the ferroelectric memory device comprising:
    a main bit line disposed intersecting word lines;
    a plurality of local bit lines associated with the main bit line and disposed intersecting the word lines;
    a plurality of first switching elements provided between the local bit lines and the main bit line, respectively, for selectively connecting one of the plurality of local bit lines to the main bit line;
    a plurality of memory cells provided at intersecting positions between the word lines and the plurality of local bit lines, respectively; and
    a plurality of redundant memory cells provided at intersecting positions between the main bit line and the word lines,
    wherein, when the memory cells include a malfunctioning memory cell, the malfunctioning memory cell is prohibited from operating, and the redundant memory cell performs a substitute operation, and conduction states of the plurality of first switching elements are set such that the local bit line connected with the malfunctioning memory cell is connected to the main bit line.

2. A ferroelectric memory device according to claim 1, further comprising a redundancy control circuit that controls to have the redundant memory cell operate as a substitute of the malfunctioning memory cell, wherein, when an address signal designating the malfunctioning memory cell is inputted as a target for data reading or data writing, the redundancy control circuit.
    (a) outputs a prohibition signal to prohibit an operation of the malfunctioning memory cell,
    (b) outputs a permission signal to permit an operation of one of the redundant memory cells to be substituted for the malfunctioning memory cell, and
    (c) keeps a conduction state of the first switching element that is provided between the local bit line connected with the malfunctioning memory cell and the main bit line associated with the local bit line.

3. A ferroelectric memory device according to claim 2, further comprising second switching elements provided between the redundant memory cells and the main bit line, respectively,
    wherein, when an address signal designating the malfunctioning memory cell is inputted as a target for data reading or data writing, the redundancy control circuit outputs a second control signal to make the second switching elements conductive.

4. A ferroelectric memory device according to claim 3, wherein the permission signal also serves as the second control signal.

5. A ferroelectric memory device according to claim 3, wherein an output signal obtained by inputting the first control signal to be outputted to each of the first switching elements in a logical sum circuit is used as the second control signal.

6. A ferroelectric memory device according to claim 3, wherein the first switching element and the second switching element have substantially identical characteristics.

7. A ferroelectric memory device according to claim 4, wherein the first switching element and the second switching element have substantially identical characteristics.

8. A ferroelectric memory device according to claim 5, wherein the first switching element and the second switching element have substantially identical characteristics.

9. An electronic apparatus equipped with the ferroelectric memory device recited in claim 1.

* * * * *